US009306256B2

(12) United States Patent
Bulja

(10) Patent No.: US 9,306,256 B2
(45) Date of Patent: Apr. 5, 2016

(54) PHASE SHIFTING DEVICE

(75) Inventor: Senad Bulja, Ashtown (IE)

(73) Assignee: Alcatel Lucent, Boulogne-Billancourt (FR)

( * ) Notice: Subject to any disclaimer, the term of this patent is extended or adjusted under 35 U.S.C. 154(b) by 171 days.

(21) Appl. No.: 14/005,068

(22) PCT Filed: Mar. 2, 2012

(86) PCT No.: PCT/EP2012/000924

§ 371 (c)(1),
(2), (4) Date: Nov. 22, 2013

(87) PCT Pub. No.: WO2012/123072

PCT Pub. Date: Sep. 20, 2012

(65) Prior Publication Data

US 2014/0077894 A1 Mar. 20, 2014

(30) Foreign Application Priority Data

Mar. 16, 2011 (EP) .................................... 11360012

(51) Int. Cl.
*H03H 7/20* (2006.01)
*H01P 1/18* (2006.01)
*H01P 3/08* (2006.01)

(52) U.S. Cl.
CPC ........................................ *H01P 1/18* (2013.01)

(58) Field of Classification Search
CPC ............... H03H 7/20; H01P 3/08; H01P 9/00; H01P 1/18
USPC .......................................... 333/139, 164, 117
See application file for complete search history.

(56) References Cited

U.S. PATENT DOCUMENTS 3,882,431 A 5/1975 Hopwood et al.
4,205,282 A * 5/1980 Gipprich ....................... 333/161
4,859,972 A 8/1989 Franke et al.

(Continued)

FOREIGN PATENT DOCUMENTS

CN 101283480 A 10/2008
DE 102 53 927 A1 6/2004

(Continued)

OTHER PUBLICATIONS

S. Bulja, et al., "Liquid Crystal Based Phase Shifters in 60 GHz Band," Proceedings of the 3rd European Wireless Technology Conference, Sep. 27-28, 2010, pp. 37-40, Paris, France.

(Continued)

*Primary Examiner* — Dean Takaoka
(74) *Attorney, Agent, or Firm* — Fay Sharpe LLP

(57) ABSTRACT

A phase shifting device is disclosed. The phase shifting device comprises an input operable to receive an input signal to be adjusted; a coupling device coupled with the input and with an output; and at least one lumped equivalent impedance transformer circuit coupled with the coupling device to receive the input signal, the lumped equivalent impedance transformer circuit having liquid crystal variable capacitors operable to adjust the input signal in response to a bias voltage applied thereto and to provide the adjusted input signal to the coupling device as an output signal. Rather than using a microstrip structure, a lumped element equivalent is instead used, which makes it possible to exploit the advantages of a liquid crystal structure but in a more compact form.

17 Claims, 10 Drawing Sheets

(56) References Cited

U.S. PATENT DOCUMENTS

| | | | | |
|---|---|---|---|---|
| 5,084,801 | A | 1/1992 | El-Hamamsy et al. | |
| 5,270,671 | A * | 12/1993 | Waterman | 333/161 |
| 5,895,775 | A * | 4/1999 | Shiau | 505/210 |
| 6,020,795 | A * | 2/2000 | Kim | 333/33 |
| 6,496,147 | B1 * | 12/2002 | Kirino | 343/700 MS |
| 7,259,642 | B2 * | 8/2007 | Kirino | 333/164 |
| 7,336,143 | B2 * | 2/2008 | Katsumata et al. | 333/139 |
| 2009/0009264 | A1 * | 1/2009 | Morikaku et al. | 333/139 |
| 2009/0278624 | A1 * | 11/2009 | Tsai et al. | 333/167 |
| 2009/0278744 | A1 | 11/2009 | Kirino et al. | |

FOREIGN PATENT DOCUMENTS

| | | |
|---|---|---|
| EP | 1 128 459 A2 | 8/2001 |
| EP | 1 496 614 A1 | 1/2005 |
| JP | 2002-076810 | 3/2002 |
| JP | 2008-079027 | 4/2008 |
| KR | 10 2004 0066523 | 7/2004 |
| WO | WO 2010/076085 | 7/2010 |

OTHER PUBLICATIONS

Yi-Fan Ruan, et al., "Reflective Adjustable Phase-shifter," Journal of Microwaves, Apr. 2005, pp. 130-133, vol. 21 Supplement, Beijing University of Technology, Beijing, China.

Andrew Yeh, et al., "Microwave Characteristics of Liquid-Crystal Tunable Capacitors," IEEE Electron Device Letters, Jul. 2005, pp. 451-453, vol. 26, No. 7.

International Search Report for PCT/EP2012/000924 dated Jul. 16, 2012.

* cited by examiner

PHASE SHIFTING DEVICE

FIELD OF THE INVENTION

The present invention relates to a phase shifting device.

BACKGROUND

Signal processing devices such as phase shifting devices are known.

Such signal processing devices typically receive a signal to be processed by the signal processing device and provide a signal processed by the signal processing device. The signal processing typically changes the received signal in some way to make it suitable for onwards transmission. Such signal processing devices may be used in telecommunications systems and may be required to operate at high frequencies. For example, signal processing devices such as phase shifters are required to process signals operating in the gigahertz region.

The choice of phase shifter for a particular application is influenced by many factors; for example, the amount of phase shift obtainable from the device, the insertion losses caused by the device and the power handling capability of the device. For lower power handling capabilities, the variation in phase shift is obtained by using a varactor and pin diode arrangement to achieve a variation of insertion phase. Although such phase shifters provide acceptable performance for low power operations, they have their shortfalls and these shortfalls are compounded in a typical telecommunications system where each radio frequency system usually requires a great number of such phase shifters.

Accordingly, it is desired to provide an improved phase shifting device.

SUMMARY

According to a first aspect, there is provided a phase shifting device as claimed in claim 1.

The first aspect recognises that the voltage tunability of the dielectric properties of liquid crystals can be utilised in a phase shifting device and that a phase shifting device based on liquid crystals may provide a convenient, controllable, accurate and low-cost device. In principle, liquid crystals are anisotropic dielectric materials which means that they exhibit different dielectric properties with regard to the direction of the applied electric or magnetic field. However, the first aspect also recognises that operating liquid crystal technology in phase shifting devices operating in the low gigahertz region faces an immediate problem. Generally, the size of the device is comparable to the wavelength at which the device operates and, as the frequency decreases, the wavelength increases and so does the size of the radio frequency device. For example, the free space wavelength at 60 gigahertz (millimeter wave frequency) is 5 mm, whilst the free space wavelength at 2 gigahertz (S-band) is 150 mm. This infers that a liquid crystal base phase shifting device operating at 2 gigahertz has a size that is approximately 30 times greater than its equivalent at 60 gigahertz if direct scaling is used. Accordingly, when using liquid crystal structures in the design of a reflective type phase shifter, as shown in FIG. 1, the reflective loads are realised using a liquid crystal formed electrode that is in effect a resonant microstrip line. As the microstrip line is formed on a liquid crystal substrate, its length at a frequency of 60 gigahertz is in the order of 2 mm. However, when implementing such a structure at lower frequencies (for example, 2 gigahertz), the length of the microstrip line needs to be approximately 30 times longer. This results in increasingly long microstrip lines which can soon become a prohibitive length. Hence, the first aspect recognises that it is desirable to provide a phase shifting device that has a size which is comparable with existing devices without compromising its performance.

The first aspect recognises that if, rather than using a microstrip structure, a lumped element equivalent is instead used, then it is possible to exploit the advantages of a liquid crystal structure but in a more compact form. It will be appreciated that the characteristics of a microstrip line can be represented by a lumped element equivalent made up of a network of inductors and capacitors. This enables only the capacitors to be realised using a liquid crystal substrate while the inductors can be realised using standard technologies such as, for example, surface mount. In this way, the equivalent size of the device is significantly reduced and its dimensions may be effectively determined by the length of the inductors.

Accordingly, a phase shifting device may be provided. The phase shifting device may comprise an input which receives an input signal to be adjusted by the phase shifting device. A coupling device may be provided which may couple the input with an output. The coupling device may also be coupled with at least one lumped equivalent impedance transformer circuit. The input signal may then be received by the lumped equivalent impedance transformer circuit. Liquid crystal variable capacitors may be provided within the lumped equivalent impedance transformer circuit. The liquid crystal variable capacitors may then adjust the input signal in response to a bias voltage applied to the liquid crystal variable capacitors and provide that adjusted input signal to the coupling device as an output signal. In this way, it can be seen that rather than using a microstrip line as an impedance transformer, a lumped equivalent circuit may instead be provided.

It will be appreciated that a lumped element equivalent circuit may include a network of discrete reactive devices providing the equivalent characteristics of a microstrip line. Some of these reactive devices may be provided by liquid crystal variable capacitors whose reactance is variable in response to a bias signal applied to those variable capacitors. Using a lumped equivalent impedance transformer circuit provides a variability to enable the input signal to be adjusted whilst also enabling a compact circuit arrangement to be provided.

In one embodiment, the lumped equivalent impedance transformer circuit comprises a half wavelength lumped equivalent impedance transformer circuit comprising a pair of inductors in series coupled, at ends thereof, with first, second and third liquid crystal variable capacitors operable to present both a variable impedance and a variable effective electrical length to the hybrid coupler in response to the bias voltage to provide an adjusted phase input signal as the output signal. Accordingly, the lumped equivalent impedance transformer circuit may comprise a network of three liquid crystal variable capacitors coupled with two inductors to provide an equivalent circuit of discrete components which is equivalent to a half wavelength microstrip line. By providing a lumped equivalent circuit which is equivalent to a half wavelength microstrip line, it is possible to readily adjust the phase of the input signal by biasing the variable capacitors to change their capacitance. Implementing the half wavelength microstrip line as a lumped equivalent circuit helps to de-couple any direct scaling relationship between the size of the circuit and its operating frequency. In other words, a multiple decrease in operating frequency no longer inevitably results in a corresponding multiple increase in the length of components of the circuit.

In one embodiment, the first and the second liquid crystal variable capacitors have matching capacitances.

In one embodiment, an absolute value of a reactance of the first and second liquid crystal variable capacitors matches an absolute value of a reactance of each of the pair of inductors.

In one embodiment, the second liquid crystal variable capacitor has a capacitance which is double the capacitance of each of the first and the third liquid crystal variable capacitors.

In one embodiment, the lumped equivalent impedance transformer circuit comprises integer multiples of the half wavelength lumped equivalent impedance transformer circuit.

In one embodiment, the lumped equivalent impedance transformer circuit comprises a half wavelength lumped equivalent impedance transformer circuit comprising a pair of liquid crystal variable capacitors in series coupled, at ends thereof, with first, second and third inductors operable to present both a variable impedance and a variable effective electrical length to the hybrid coupler in response to the bias voltage to provide an adjusted phase input signal as the output signal.

In one embodiment, the pair of liquid crystal variable capacitors have matching capacitances.

In one embodiment, an absolute value of a reactance of the first and second inductors matches an absolute value of each of the pair of liquid crystal variable capacitors.

In one embodiment, the second inductor has an inductance which is half the inductance of each of the first and the third inductors.

In one embodiment, the lumped equivalent impedance transformer circuit comprises integer multiples of the half wavelength lumped equivalent impedance transformer circuit.

In one embodiment, the lumped equivalent impedance transformer circuit comprises at least a pair of the half wavelength lumped equivalent impedance transformer circuits. Accordingly, depending on the device implementation, it may be necessary to provide a pair of half wavelength lumped equivalent impedance transformer circuits in order to enable the coupling device to operate correctly and provide the required output signal from the input signal.

In one embodiment, the lumped equivalent impedance transformer circuit comprises at least a pair of the half wavelength lumped equivalent impedance transformer circuits both coupled in parallel with the hybrid coupler.

In one embodiment, the lumped equivalent impedance transformer circuit comprises at least a pair of the half wavelength lumped equivalent impedance transformer circuits coupled by a quarter wave impedance transformer. Accordingly, each lumped equivalent impedance transformer circuit may comprise two or more half wavelength lumped equivalent impedance transformer circuits coupled together by a quarter wave impedance transformer. It will be appreciated that by providing additional half wavelength lumped equivalent impedance transformer circuits improves the bandwidth of the device. Furthermore, an increased phase shift is possible. However, this can lead to increased insertion losses. This can be addressed by reducing the amount of phase shift provided by each half wavelength lumped equivalent impedance transformer circuit, but ensuring that the total phase shift for the pair is greater than a predetermined amount such as, for example, 90° over as broad a bandwidth as possible. The reduction of phase shift provided by each half wavelength equivalent impedance transformer circuit has the consequence of a reduction in length of the liquid crystal variable capacitors which can reduce device size.

In one embodiment, the lumped equivalent impedance transformer circuit comprises at least a first pair of the half wavelength lumped equivalent impedance transformer circuits coupled by a quarter wave impedance transformer and at least a second pair of the half wavelength lumped equivalent impedance transformer circuits coupled by a quarter wave impedance transformer, the first pair and the second pair both being coupled in parallel with the hybrid coupler. Accordingly, first and second pairs of the half wavelength lumped equivalent impedance transformer circuits may both be coupled with the hybrid coupler in order to receive and output the appropriate signals.

In one embodiment, the liquid crystal variable capacitors comprise parallel plate liquid crystal variable capacitors.

In one embodiment, the inductors comprise microstrip lines.

Further particular and preferred aspects of the present invention are set out in the accompanying independent and dependent claims. Features of the dependent claims may be combined with features of the independent claims as appropriate and in combinations other than those explicitly set out in the claims.

BRIEF DESCRIPTION OF THE DRAWINGS

Embodiments of the present invention will now be described further, with reference to the drawings in which.

DESCRIPTION OF THE EMBODIMENTS

Overview

Before discussing embodiments in any detail, an overview of phase shifting devices according to embodiments will now be described. As mentioned above, embodiments recognize that phase shifting devices, particularly those operating at high frequencies (such as the gigahertz frequencies utilised by wireless telecommunications equipment) can utilise resonant liquid crystal electrodes as resonant microstrip lines in order to perform the required signal processing. However, as mentioned above, a problem with utilising liquid crystal structures in this way is that as the operating frequency of the devices reduces, the length of the resonant liquid crystal electrodes needs to increase.

As mentioned above, FIG. 1 illustrates a phase shifter implemented using a microstrip line. The phase shifter receives an input at one input of a hybrid coupler and outputs the phase shifted output signal from an output of the hybrid coupler. The input signal is split and provided with a phase shift to both resonant liquid crystal electrode microstrip lines. The length of the resonant liquid crystal electrode microstrip line will be dependent on the frequency of the input signal to be processed. For a 2 gigahertz signal, the length of the resonant liquid crystal electrode microstrip lines will need to be around 60 mm. This length increases as the frequency decreases. Applying a bias voltage to the resonant liquid crystal electrode microstrip lines will cause a phase shift in the output signal.

Rather than using liquid crystal devices as resonant electrodes, embodiments instead provide a lumped element equivalent circuit made of discrete reactive components which has the same characteristics as a resonant microstrip line. The same effect as the microstrip line can therefore be provided using the lumped equivalent circuit and the characteristics of the circuit adjusted by adjusting characteristics of the discrete components. In particular, such lumped equivalent circuits comprise a network of inductors and capacitors, the capacitors being formed from liquid crystal structures to provide a variable capacitor whose characteristics can be varied by applying a bias voltage to the liquid crystal structure.

In this way, it can be seen that a phase shifting device which performs signal processing using at least one resonant microstrip line may instead be implemented using discrete devices forming a lumped equivalent circuit which enables changes to the input signal to be made, simply by varying the bias applied to liquid crystal variable capacitors provided as at least one of the discrete components within the lumped equivalent circuit. By avoiding the use of actual resonant microstrip lines, the dimensions of the device are influenced less by its operating frequency, which is dictated by the frequency of the input signal. It will be appreciated that such an approach provides for a compact and scalable phase shifting device.

Figure 2:
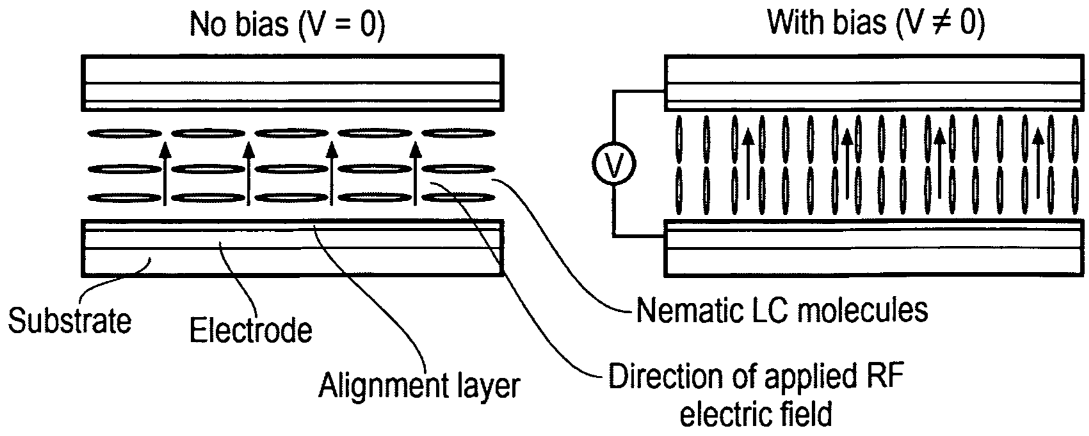
FIG. 2 illustrates a liquid crystal structure.

Before discussing the phase shifting device arrangements in more detail, an overview of liquid crystal devices will now be given. The molecules of the most commonly used liquid crystal phase, nematic, can be treated as elongated rods which orientate themselves alongside the direction of the applied electric or magnetic field. The orientation of these elongated molecules with respect to the applied field gives rise to dielectric anisotropy, as shown in FIG. 2. Here, the molecules of a nematic liquid crystal are contained within a system of two electrodes, conveniently deposited on a substrate. In this illustrative example, the electrodes are treated with polyimide, which acts as an alignment layer needed to ensure the orientation of the molecules of the liquid crystal in a predefined direction in the absence of an applied field. This effectively defines the “ground” or “zero” state of the liquid crystal molecules, macroscopically characterised by a relative dielectric constant of the liquid crystal layer $\in_{r_\perp}$, where $\perp$ indicates that the direction of the RF electric field is perpendicular to the direction of the liquid crystal molecules. As the bias voltage (a DC or low frequency voltage) is increased, the molecules of the liquid crystal orientate themselves in the direction of the applied field, giving rise to a different dielectric constant of the liquid crystal layer $\in_{r_P}$, where P indicates that the liquid crystal molecules and the RF electric field are parallel to each other. Viewed in this way, the dielectric constant of the liquid crystals is voltage tuneable and the degree of tunability is determined by the difference between the two relative dielectric constants, referred to as the dielectric anisotropy, $\Delta\in_r=\in_{r_P}-\in_{r_\perp}$. At RF frequencies $\in_{r_\perp}$:2.7 and $\in_{r_P}$: 3.2 but it may vary depending on the type of liquid crystal used. The two-electrode liquid crystal system shown in FIG. 2 is effectively a voltage tuneable parallel plate capacitor with the capacitance ratio given by $$r_c = \frac{C_{max}}{C_{min}} = \frac{\varepsilon_{r_P}}{\varepsilon_{r_\perp}} \approx 1.2.$$

Lumped Equivalent Circuits

The building blocks for the signal processor are lumped equivalent circuits incorporating liquid crystal variable capacitors which replace half wavelength resonant microstrip lines used in various configurations. Four example lumped equivalent circuits will now be described.

Example 1

Figure 3:
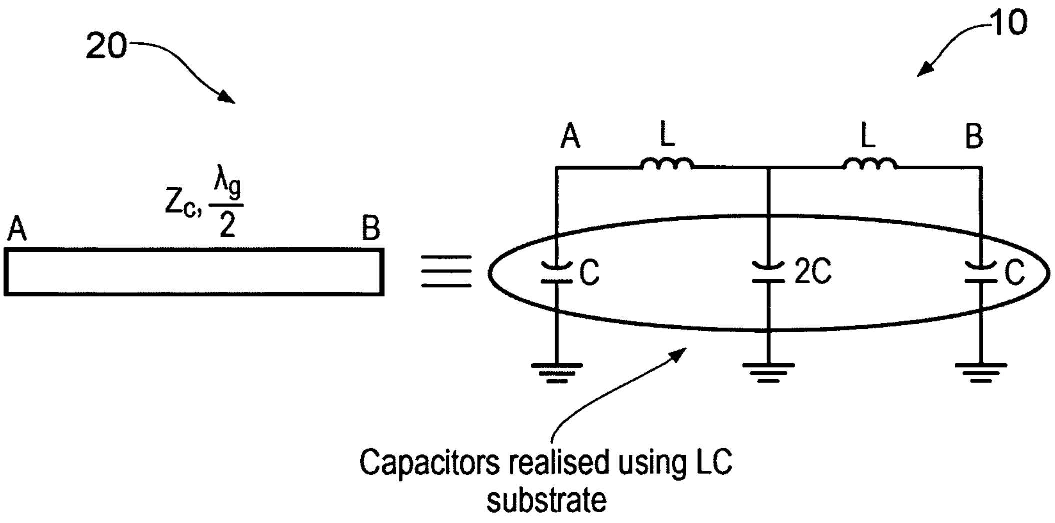
FIG. 3 illustrates a lumped equivalent circuit which corresponds to a half wavelength resonant microstrip line.

FIG. 3 illustrates a lumped equivalent circuit 10 which corresponds to a half wavelength resonant microstrip line 20. The lumped equivalent element circuit 10 is a network of reactive discrete devices. In this example, point A illustrated on the network 10 corresponds with point A shown on the half wavelength microstrip device 20, as does point B.

The network 10 comprises two inductors and three liquid crystal variable capacitors. The inductors are arranged in a series between points A and point B. A first capacitor is provided with one of the inductors in parallel with respect to point A. Likewise, a capacitor is provided in parallel with the second inductor with respect to point B. A third capacitor is provided coupled to a node between the first and second inductor. The inductors have matching inductances. The first and second capacitors have matching capacitances. The capacitance of the third capacitor is twice that of the first or second capacitances. The absolute value of the reactance of the first or the second capacitors matches the absolute value of the reactance of the first or second inductors.

The capacitors are implemented on a liquid crystal substrate. The inductors can be implemented using a microstrip line or standard surface mount technology. This enables the size of the equivalent lumped circuit 10 to be significantly reduced compared to the resonant liquid crystal electrode microstrip line shown in FIG. 1, with the length of the equivalent lumped circuit 10 effectively being determined by the length of the inductors.

The phase shift of the equivalent lumped circuit 10 can be achieved by altering the bias voltage applied to the liquid crystal substrate in which the liquid crystal variable capacitors are formed.

This equivalent lumped circuit 10 can be used in a liquid crystal based phase shifter, together with its integer multiples, i.e.

$$n\frac{\lambda_g}{2},$$

with n=1, 2, 3 . . . .

Example 2

Figure 4:
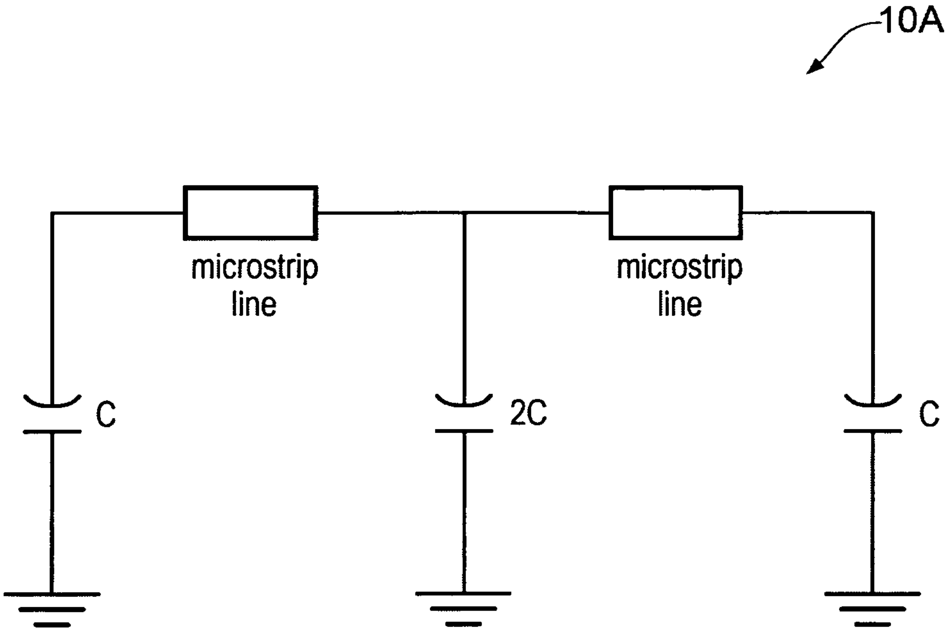
FIGS. 4 to 6 illustrate alternative lumped equivalent circuits which corresponds to a half wavelength resonant microstrip line.

An alternative way of obtaining a half-wavelength approximation of the microstrip line 20 is illustrated in FIG. 4, which shows an equivalent lumped circuit 10A. In this arrangement, a short length of a microstrip line is used to represent the lumped inductors of FIG. 3.

This equivalent lumped circuit 10A can be used in a liquid crystal based phase shifter, together with its integer multiples, i.e.

$$n\frac{\lambda_g}{2},$$

with n=1, 2, 3 . . . .

Example 3

Figure 5:
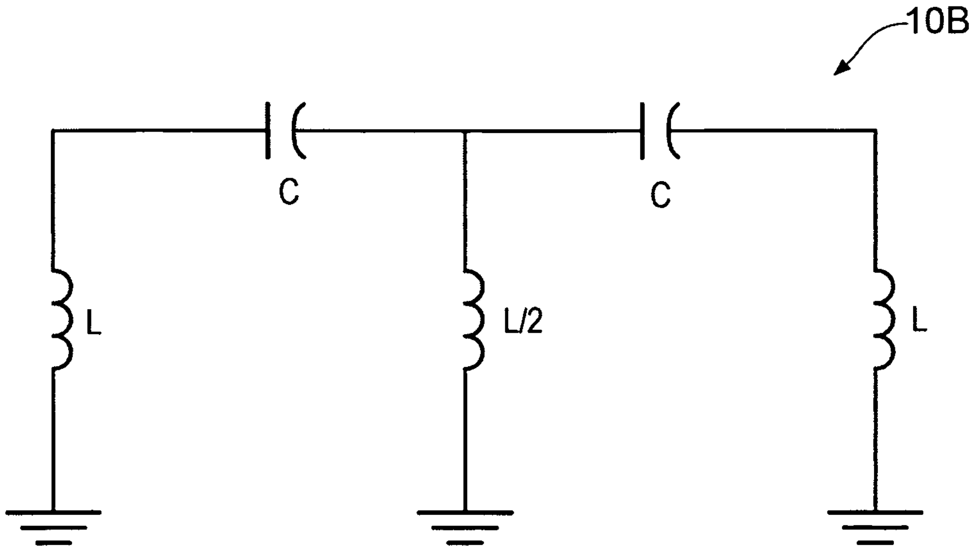

An alternative way of obtaining a half-wavelength approximation of the microstrip line 20 is illustrated in FIG. 5, which shows an equivalent lumped circuit 10B.

In this example, the equivalent lumped circuit 10B is equivalent to a third integer multiple of a half-wavelength microstrip line, i.e.

$$\frac{3\lambda_g}{2};$$

(this is similar to the lumped equivalent circuit 10 circuit of FIG. 3, but with n=3).

This equivalent lumped circuit 10B can be used in a liquid crystal based phase shifter, together with its integer multiples, i.e.

$$n\frac{3\lambda_g}{2},$$

n=1, 2, 3 . . . .

Example 4

Figure 6:
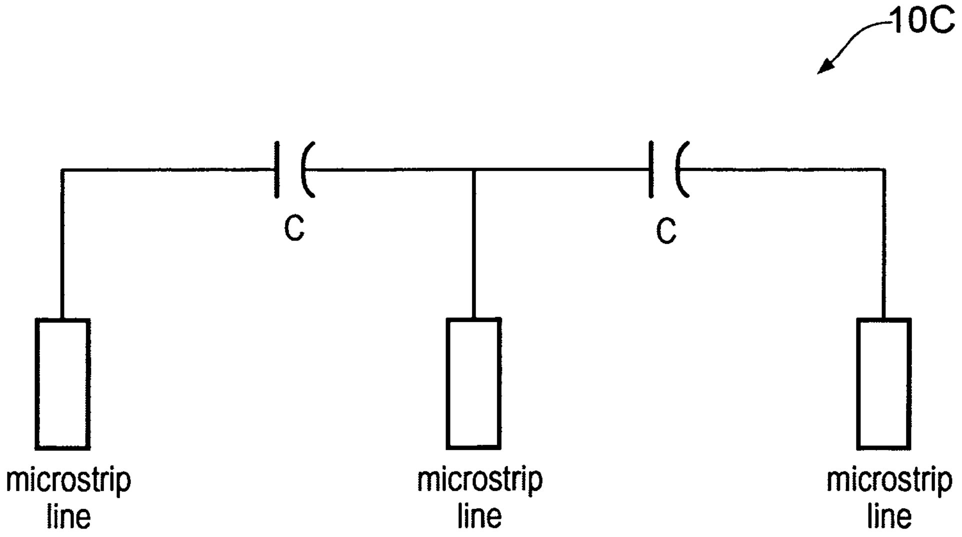

An alternative way of obtaining a half-wavelength approximation of the microstrip line 20 is illustrated in FIG. 6, which shows an equivalent lumped circuit 10C. In this arrangement, a short length of a microstrip line is used to represent the lumped inductors of FIG. 5.

This equivalent lumped circuit 10C can be used in a liquid crystal based phase shifter, together with its integer multiples, i.e.

$$n\frac{3\lambda_g}{2},$$

n=1, 2, 3 . . . .

Phase Shifter

Example 1

Single Load

Figure 1:
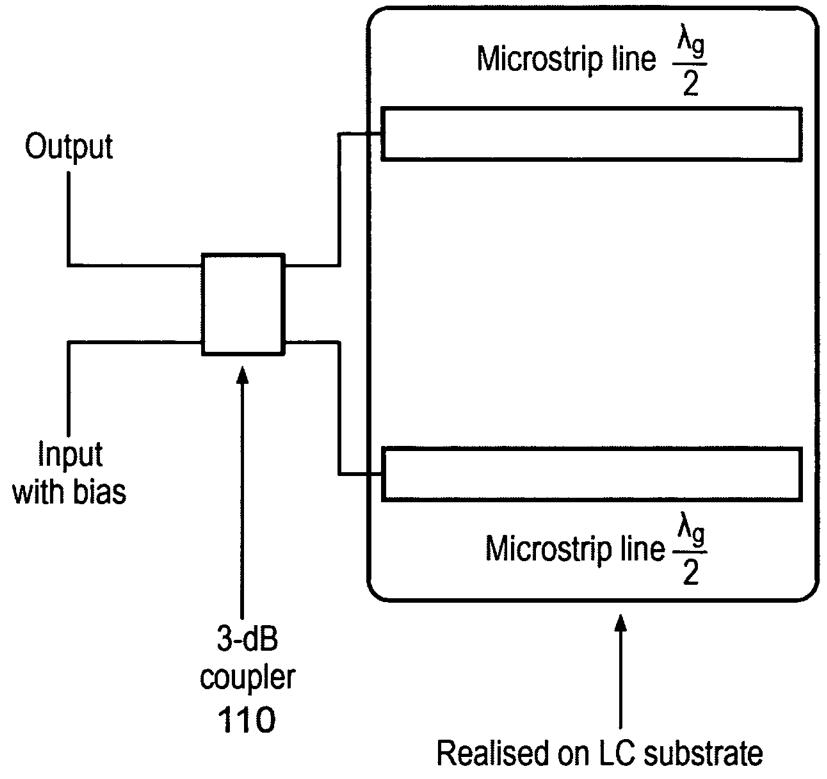
FIG. 1 illustrates a reflective type phase shifter.
Figure 7:
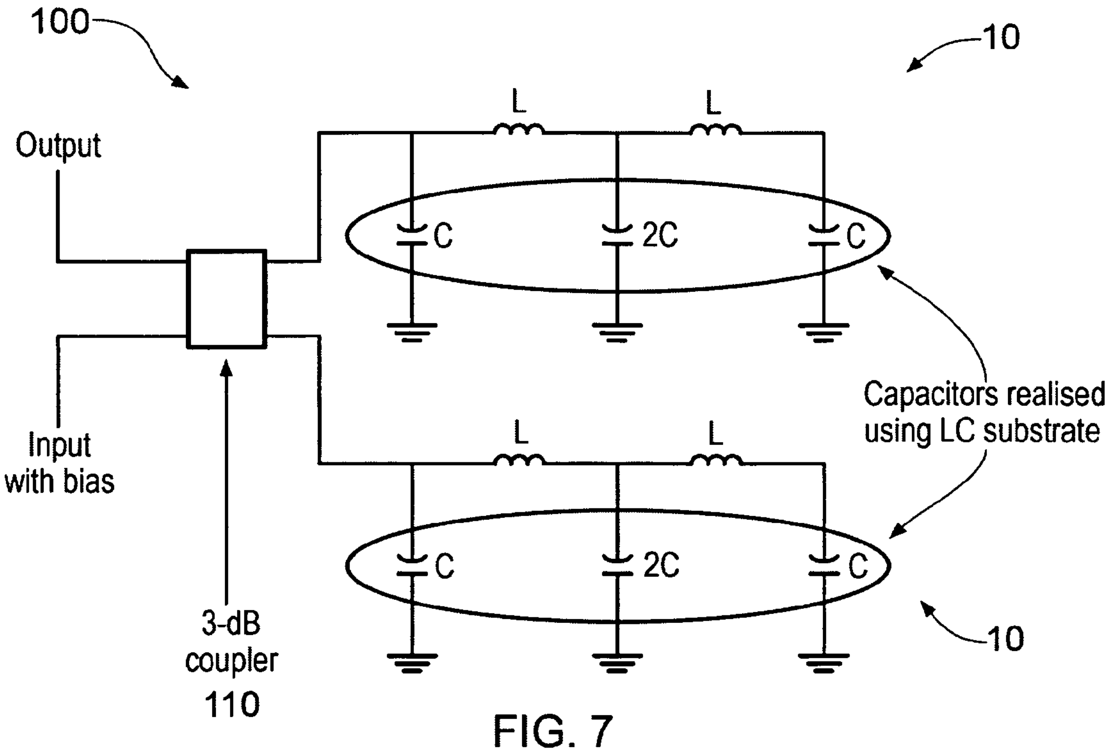
FIG. 7 illustrates a first phase shifter.

FIG. 7 illustrates a voltage tuneable reflective circuit operating as a phase shifter 100 in which a pair of the lumped equivalent circuits 10 show in FIG. 3 are coupled with a hybrid coupler 110 to replace the resonant liquid crystal electrode microstrip lines shown in FIG. 1. Although the lumped equivalent circuit of FIG. 3 is used as a building block for this phase shifter 100, it will be appreciated that other of the lumped equivalent circuits could be used.

Figure 8A:
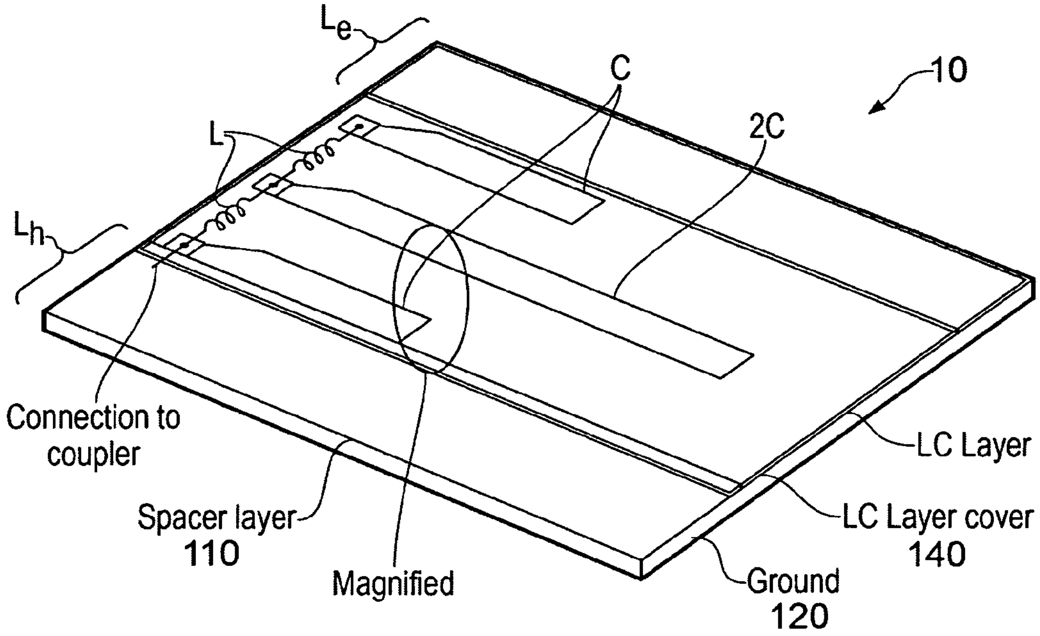
FIGS. 8*a* to 8*c* show an example implementation of the equivalent lumped circuit used as a building block for the phase shifter of FIG. 7.
Figure 8B:
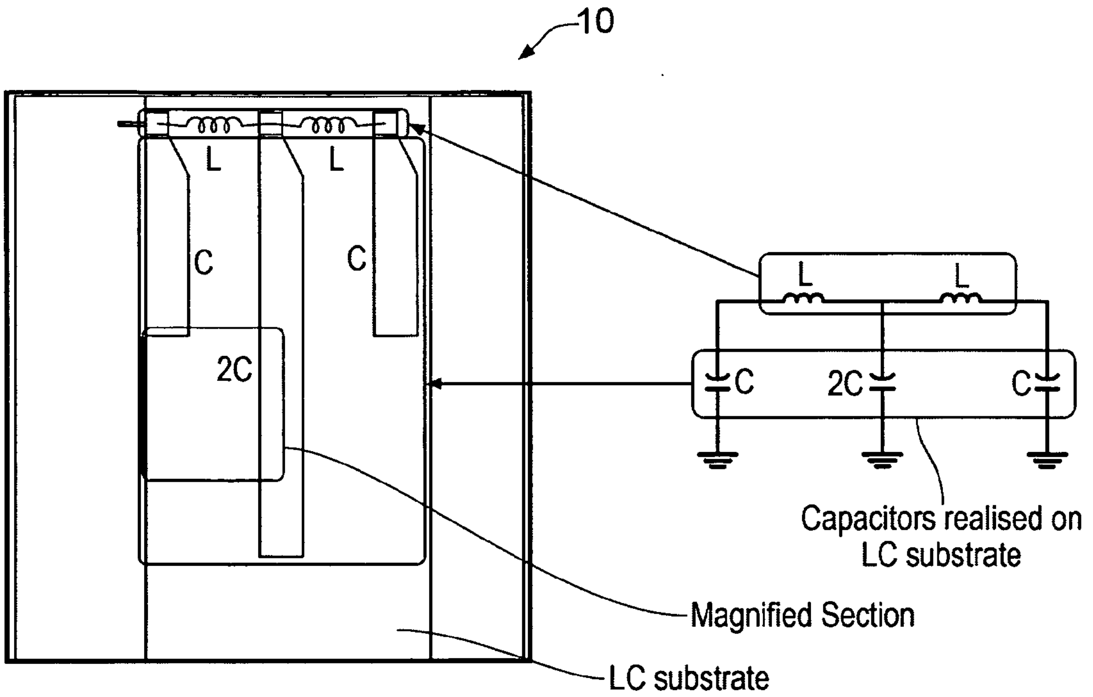
Figure 8C:
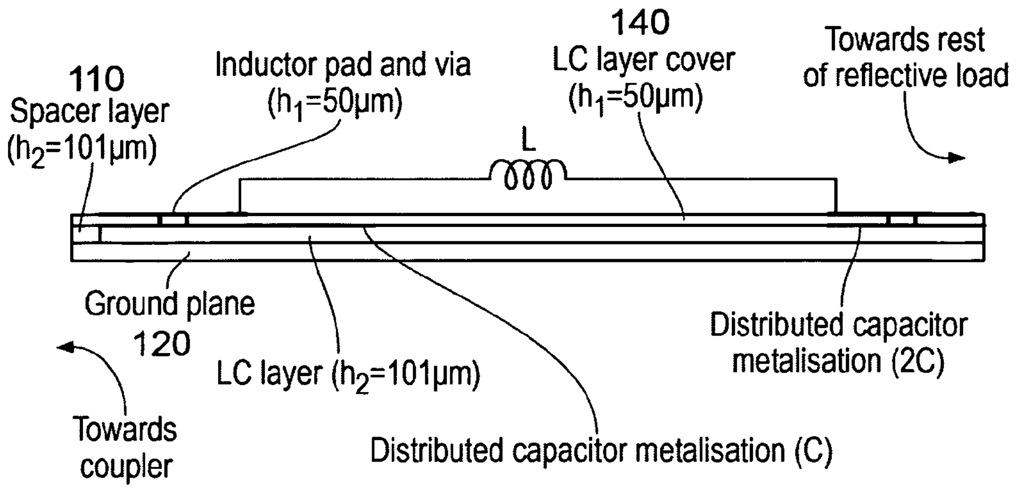

FIGS. 8*a* to 8*c* show an example implementation of the equivalent lumped circuit 10 which is used as a building block for the phase shifter 100.

As can be seen in FIGS. 8*a* to 8*c*, the reflection loads are provided on a two-layer substrate separated by a spacer layer 110 and deposited on a ground plane 120. A cavity 130 into which a liquid crystal injected is formed by two strips with lengths of $L_h$ and $L_e$ and the top liquid crystal layer cover 140. The height $H_2$ of the spacer layer 110 is around 101 μm (as a Rogers duroid material is available in this thickness) but can be increased up to about 200 μm without seriously affecting the behaviour of the liquid crystal molecules.

The reflection load is printed on the bottom surface of the top liquid crystal layer cover 140 and its height should be as small as possible. Its height $H_1$ in this example is 50 μm (as a Rogers duroid material is available in this thickness). The height of the reflection load can have implications. As the liquid crystal layer cover 140 sits directly above the liquid crystal cavity 130, the choice of material for the reflection load becomes important. Because the liquid crystal is, when viewed macroscopically, a tuneable dielectric, its tunability is reduced by the presence of the liquid crystal cover layer 140. This effect is minimised by choosing a low profile, low dielectric constant material for the liquid crystal cover layer 140; in this case $\in_{r2}$=3.48 and $H_2$ is 50 μm.

Figure 9:
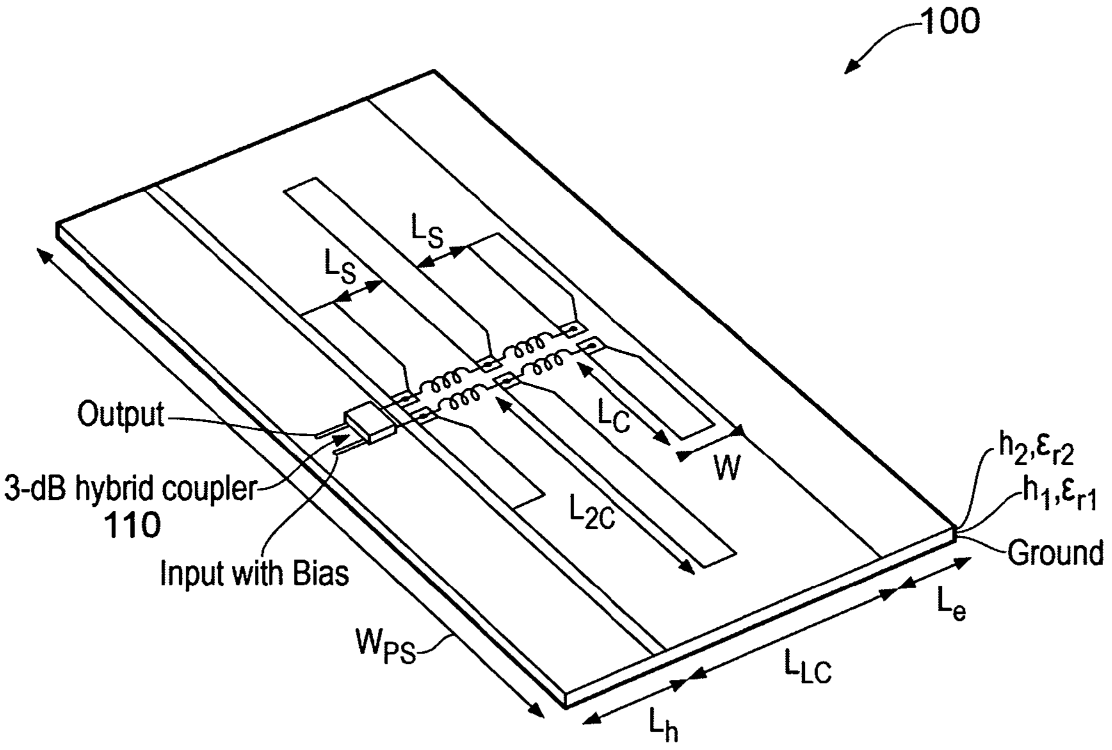
FIG. 9 shows an example implementation of the phase shifter of FIG. 7.

FIG. 9 shows an example implementation of the phase shifter 100. As can be seen, the tuneable variable capacitors are realised on the liquid crystal substrate. Their dimensions are $L_C$=7.25 mm, $L_{2C}$=14.5 mm and W=1.5 mm. These dimensions are selected so that the equivalent characteristic impedance of the microstrip line Zc is about 20 ohms on a grounded liquid crystal substrate with $\in_{r\perp}$=2.72. The chosen characteristic impedance $Z_C$ provides a compromise between the amount of phase shift and insertion losses. The spacing between the capacitors $L_S$ is determined by the length of the surface mount inductors L and should be greater than or equal to around 1 mm to allow a practical realisation of the reflective loads and to prevent coupling between neighbouring capacitors. The length $L_h$ is determined by the size of the coupler and, in this example, $L_h$ is 2.5 mm. The length $L_e$ is not critical and in this design is 1 mm. Accordingly, a device is provided having an overall size of around 11 mm by 34 mm.

Figure 10:
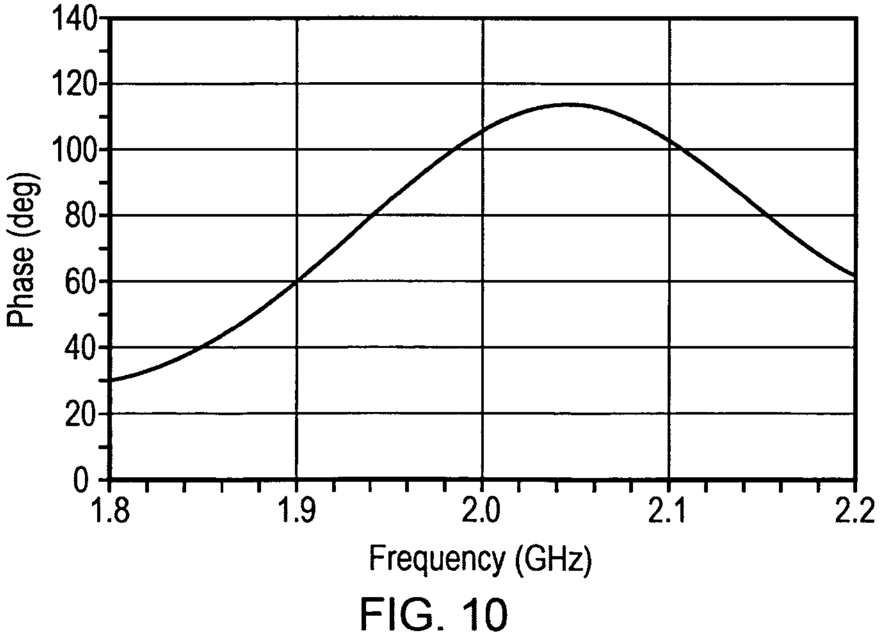
FIG. 10 shows the differential phase shift of the phase shifter of FIG. 7.
Figure 11:
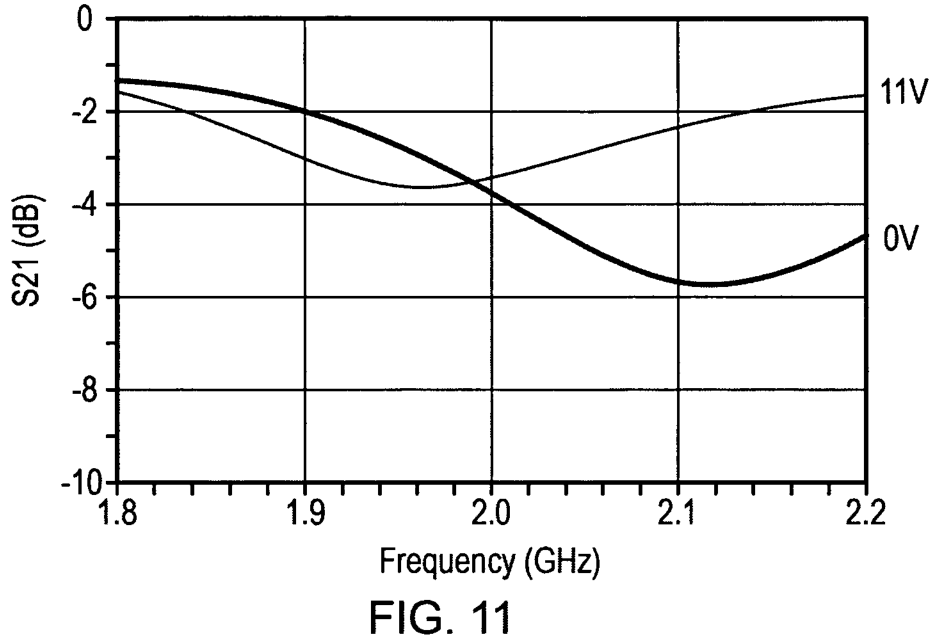
FIG. 11 shows the insertion loss of the phase shifter 100 of FIG. 7.
Figure 12:
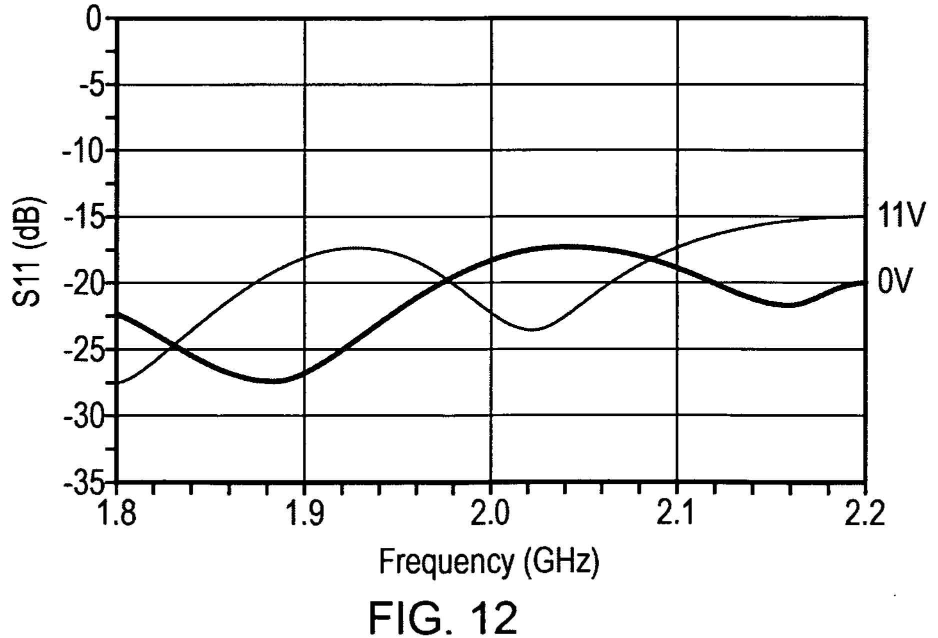
FIG. 12 shows the return loss of the phase shifter 100 of FIG. 7.

The simulated performance of the phase shifter 100 is shown in FIGS. 10 to 12. The surface mount inductors used in the simulations were represented by the .S2P files available from the AVX manufacturer's data in order to provide as realistic a performance of the device as possible.

The performance of the phase shifter 100 was simulated for two cases; the case when the applied bias voltage is 0 volts and the case when the applied bias voltage is 11 volts. Each voltage bias state is characterised by a set of dielectric properties of the liquid crystal, the dielectric constant and the loss tangent. For the particular liquid crystal used in the simulations (commonly referred to as E7), the value of the relative dielectric constants at 2 gigahertz, at voltage biases of 0 and 11, are known, but the values of the loss tangents are not. However, as the values of the loss tangents at higher frequencies are known (in the region of 30 to 60 gigahertz) they were used instead of the loss tangents at 2 gigahertz. This may have, as a consequence, predicted higher losses than will realistically occur and may lead to an understatement of the performance of the device. However, this also forms the worst case scenario of the insertion loss performance, should the loss tangents at 2 gigahertz not significantly reduce from their values at 30 gigahertz. In this particular case, the loss tangents at 30 gigahertz are $\tan(\delta_{\perp})=0.04$ (0 V) and $\tan(\delta_p)=0.02$ (11 V).

FIG. 10 shows the differential phase shift of the phase shifter 100 at 11 V ((peak)$\in_{rp}=3.18$) relative to 0 V ($\in_{r\perp}=2.72$).

FIG. 11 shows the insertion loss of the phase shifter 100 for bias voltage of a) 0 V and b) 11 V.

FIG. 12 shows the return loss of the phase shifter 100 for bias voltage of a) 0 V and b) 11 V.

As can be seen, the these Figures indicate that the phase shifter 100 achieves a 90° phase shift over a bandwidth of 170 megahertz, with a maximum insertion loss of 5.7 dB.

Example 2

Double Load

Figure 13A:
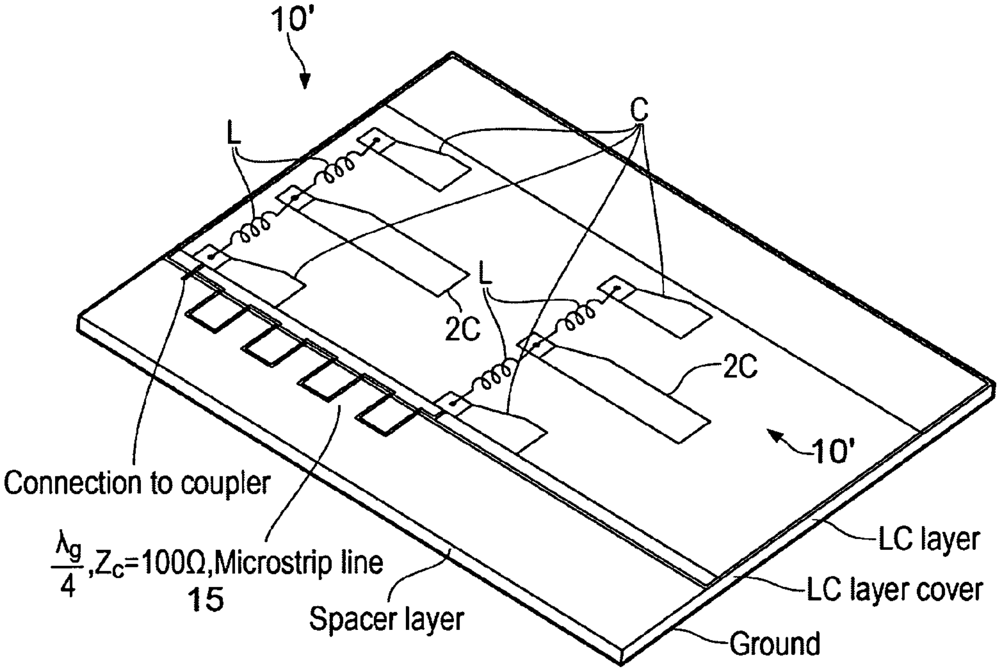
FIGS. 13*a* and 13*b* show an example implementation of a pair of equivalent lumped circuits coupled by a quarter wavelength microstrip line transformer used as a building block to provide a second phase shifter.
Figure 13B:
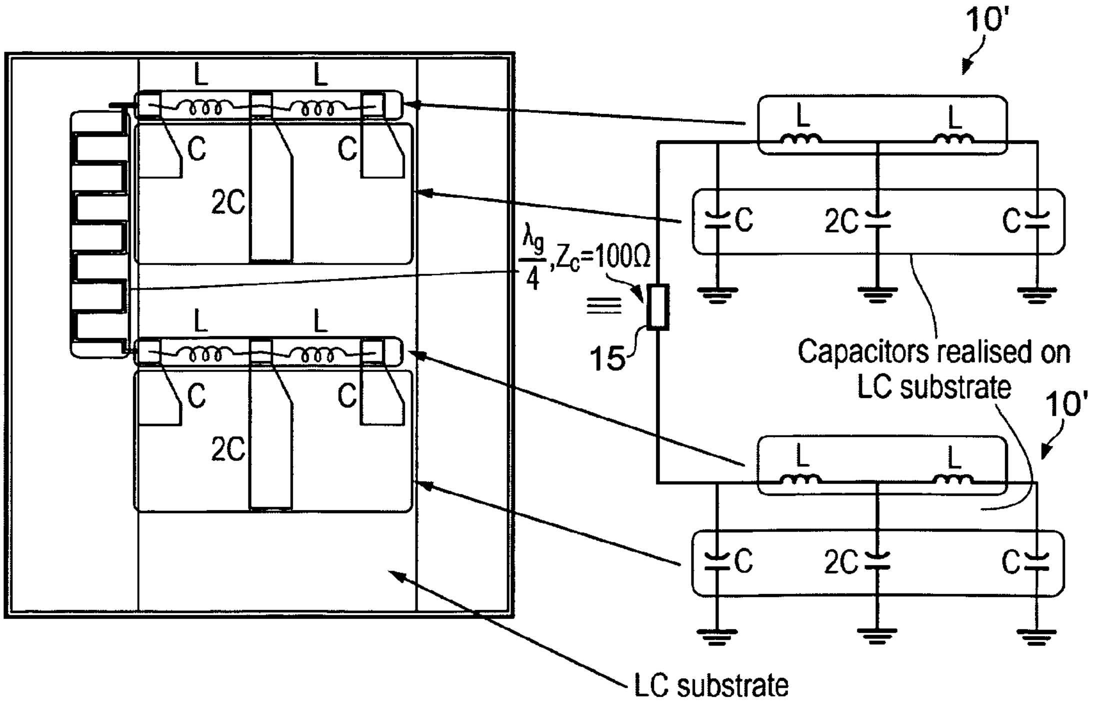

FIGS. 13*a* and 13*b* show an example implementation of a pair of the equivalent lumped circuits 10' coupled by a quarter wavelength microstrip line transformer 15 which is used as a building block to provide a phase shifter 100A which provides increased bandwidth. Although the lumped equivalent circuit of FIG. 3 is used as a building block for this phase shifter 100A, it will be appreciated that other of the lumped equivalent circuits could be used.

The advantage of this double load configuration is that it can, after some modifications to the previous arrangement, allow broadband phase shift operation and similar insertion losses as the single load arrangement described above. Furthermore, in this configuration, the phase shift obtained is doubled if the same reflective loads as that mentioned above are used. However, this also doubles the insertion losses obtained.

Accordingly, to overcome the increased losses, the amount of phase shift provided by each half wavelength equivalent lumped circuit of the double load is reduced. However, the total phase shift provided by the double load is selected to be over 90° for as broad a bandwidth as possible. The reduction of the phase shift provided by each equivalent lumped circuit 10' has the consequence of reducing the length of the liquid crystal formed variable capacitors, as now the characteristic impedance of the approximated half wavelength microstrip line $Z_C$ is set to be around 75 ohms.

Figure 14:
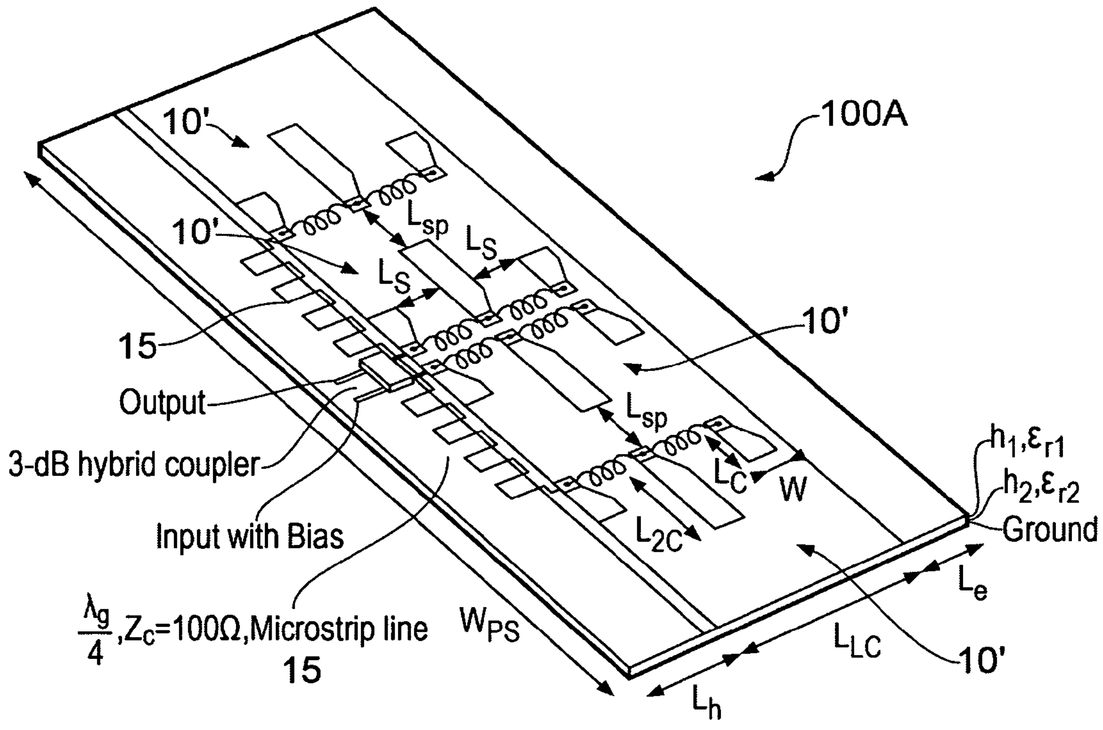
FIG. 14 shows an example implementation of the second phase shifter.

FIG. 14 shows an example implementation of the phase shifter 100A. The length of the distributed capacitors are $L_C=2.3$ mm, $L_{2C}=4.6$ mm, while the width W remains 1.5 mm. The separation between the loads $L_{SP}=1.9$ mm. The two loads are separated by a quarter wavelength transformer microstrip 15 having a characteristic impedance $Z_C$ of around 100 ohms which is needed for broadband, high phase shift operation. The quarter wavelength transformer microstrip 15 is meandered onto the substrate as indicated in FIGS. 13*a*, 13*b* and 14. The overall dimensions of the phase shifter 100A in this example are approximately 32×11 mm. All other dimensions are otherwise the same as the embodiment mentioned above.

Figure 15:
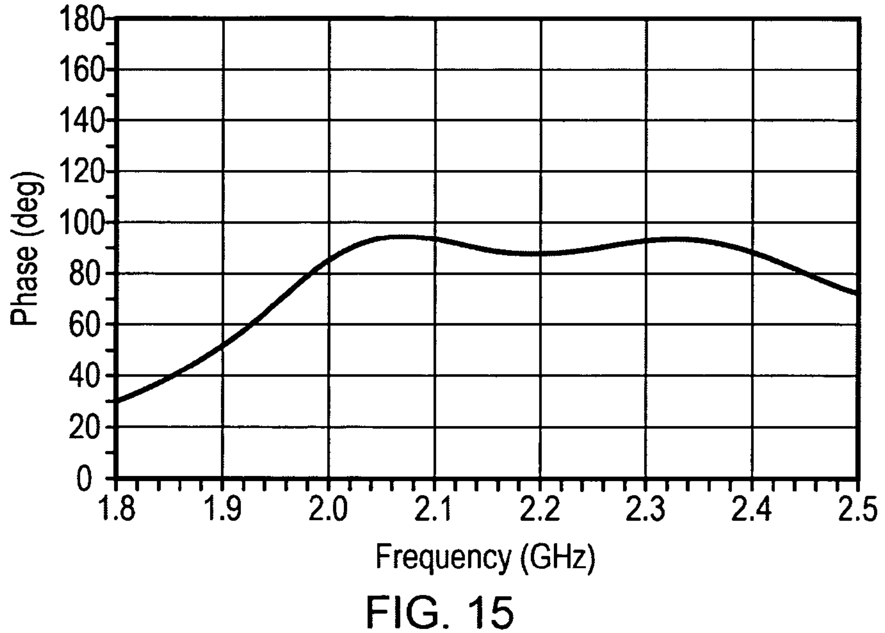
FIG. 15 shows the differential phase shift of the phase shifter of FIG. 14.
Figure 16:
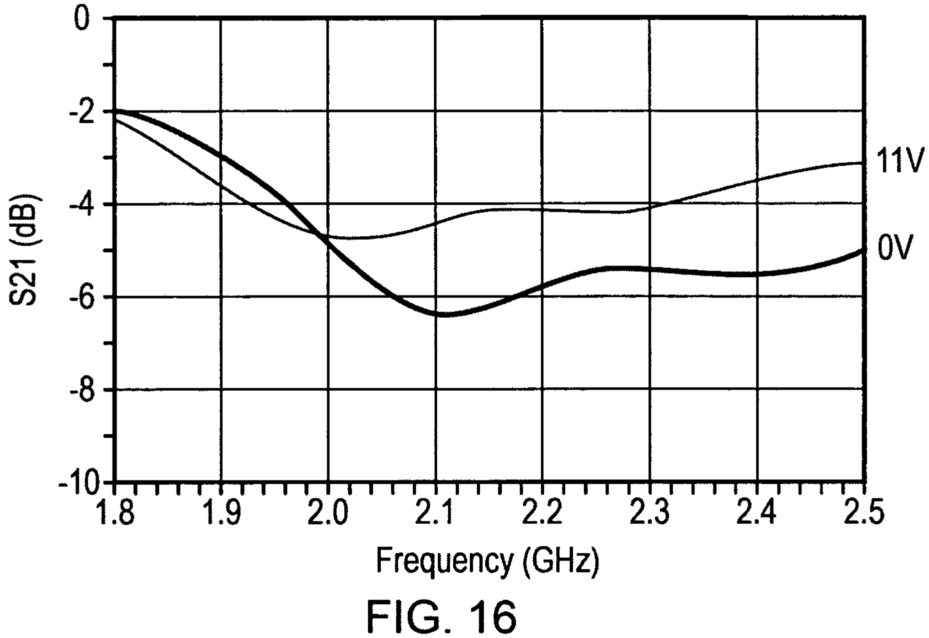
FIG. 16 shows the insertion loss of the phase shifter 100 of FIG. 14.
Figure 17:
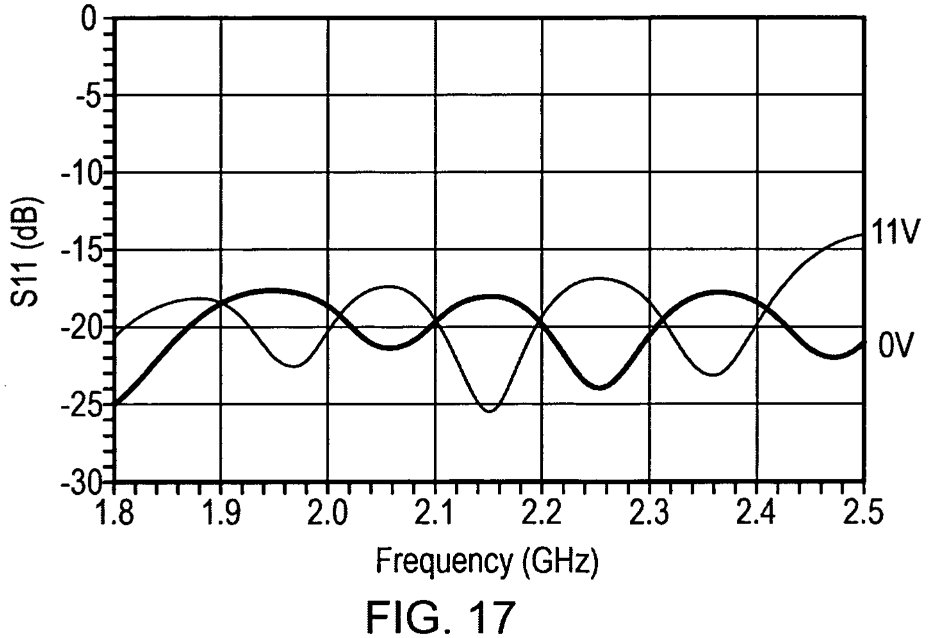
FIG. 17 shows the return loss of the phase shifter 100 of FIG. 14.

The simulated performance of the phase shifter 100A is illustrated in FIGS. 15 to 17. As with the embodiment mentioned above, higher loss tangents are assumed for the liquid crystal used at 2 gigahertz.

FIG. 15 shows the differential phase shift of the phase shifter 100A at 11 V ((peak)$\in_{rp}=3.18$) relative to 0 V ($\in_{r\perp}=2.72$).

FIG. 16 shows the insertion loss of the phase shifter 100A for bias voltage of a) 0 V and b) 11 V.

FIG. 17 shows the return loss of the phase shifter 100A for bias voltage of a) 0 V and b) 11V.

As can be seen, the simulations indicate that the device achieves a 90° phase shift over a bandwidth of approximately 370 megahertz, with a maximum insertion loss of 6.4 dB.

It will be appreciated that the reflection load can be made to have more than two loads and the bandwidth may be increased even further. Also, in order to increase the power handling capability of the liquid crystal based devices, a four-way hybrid coupler can be used which would increase power handling by 3 dB. Furthermore, the power handling of the device can be increased by extending the number of inductors and capacitors within each equivalent circuit.

The functions of the various elements shown in the Figures, including any functional blocks labelled as "processors" or "logic", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" or "logic" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the Figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. A phase shifting device, comprising:

an input operable to receive an input signal to be adjusted;

a hybrid coupler coupling the input with an output; and at least one reflective load comprising a lumped equivalent impedance transformer circuit also coupled with the hybrid coupler to receive the input signal, the lumped equivalent impedance transformer circuit having liquid crystal variable capacitors operable to adjust the input signal in response to a bias voltage applied thereto and to provide the adjusted input signal to the hybrid coupler as an output signal;

wherein the lumped equivalent impedance transformer circuit comprises a half wavelength lumped equivalent impedance transformer circuit comprising a pair of inductors in series coupled, at ends thereof, with first, second and third liquid crystal variable capacitors operable to present both a variable impedance and a variable effective electrical length to the hybrid coupler in response to the bias voltage to provide an adjusted phase input signal as the output signal, and wherein the lumped equivalent impedance transformer circuit comprises at least a pair of the half wavelength lumped equivalent impedance transformer circuits coupled by a quarter wave impedance transformer.

2. The phase shifting device of claim 1, wherein the first and the second liquid crystal variable capacitors have matching capacitances.

3. The phase shifting device of claim 1, wherein an absolute value of a reactance of the first and second liquid crystal variable capacitors matches an absolute value of a reactance of each of the pair of inductors.

4. The phase shifting device of claim 1, wherein the second liquid crystal variable capacitor has a capacitance which is double the capacitance of each of the first and the third liquid crystal variable capacitors.

5. The phase shifting device of claim 1, wherein the lumped equivalent impedance transformer circuit comprises at least a pair of the half wavelength lumped equivalent impedance transformer circuits.

6. The phase shifting device of claim 1, wherein the lumped equivalent impedance transformer circuit comprises at least a pair of the half wavelength lumped equivalent impedance transformer circuits both coupled in parallel with the hybrid coupler.

7. The phase shifting device of claim 1, wherein the lumped equivalent impedance transformer circuit comprises at least a first pair of the half wavelength lumped equivalent impedance transformer circuits coupled by a quarter wave impedance transformer and at least a second pair of the half wavelength lumped equivalent impedance transformer circuits coupled by a quarter wave impedance transformer, the first pair and the second pair both being coupled in parallel with the hybrid coupler.

8. The phase shifting device of claim 1, wherein the liquid crystal variable capacitors comprise parallel plate liquid crystal variable capacitors.

9. A phase shifting device, comprising:

an input operable to receive an input signal to be adjusted;

a hybrid coupler coupling said input with an output; and at least one reflective load comprising a lumped equivalent impedance transformer circuit also coupled with the hybrid coupler to receive the input signal, the lumped equivalent impedance transformer circuit having liquid crystal variable capacitors operable to adjust the input signal in response to a bias voltage applied thereto and to provide said adjusted input signal to the hybrid coupler as an output signal, wherein the lumped equivalent impedance transformer circuit comprises a half wavelength lumped equivalent impedance transformer circuit comprising a pair of liquid crystal variable capacitors in series coupled, at ends thereof, with first, second and third inductors operable to present both a variable impedance and a variable effective electrical length to the hybrid coupler in response to the bias voltage to provide an adjusted phase input signal as the output signal.

10. The phase shifting device of claim 9, wherein the pair of liquid crystal variable capacitors have matching capacitances.

11. The phase shifting device of claim 9, wherein an absolute value of a reactance of the first and second inductors matches an absolute value of each of the pair of liquid crystal variable capacitors.

12. The phase shifting device of claim 9, wherein the second inductor has an inductance which is half the inductance of each of the first and the third inductors.

13. The phase shifting device of claim 9, wherein the lumped equivalent impedance transformer circuit comprises at least a pair of the half wavelength lumped equivalent impedance transformer circuits.

14. The phase shifting device of claim 9, wherein the lumped equivalent impedance transformer circuit comprises at least a pair of the half wavelength lumped equivalent impedance transformer circuits both coupled in parallel with the hybrid coupler.

15. The phase shifting device of claim 9, wherein the lumped equivalent impedance transformer circuit comprises at least a pair of the half wavelength lumped equivalent impedance transformer circuits coupled by a quarter wave impedance transformer.

16. The phase shifting device of claim 9, wherein the lumped equivalent impedance transformer circuit comprises at least a first pair of the half wavelength lumped equivalent impedance transformer circuits coupled by a quarter wave impedance transformer and at least a second pair of the half wavelength lumped equivalent impedance transformer circuits coupled by a quarter wave impedance transformer, the first pair and the second pair both being coupled in parallel with the hybrid coupler.

17. The phase shifting device of claim 9, wherein the liquid crystal variable capacitors comprise parallel plate liquid crystal variable capacitors.

* * * * *